United States Patent
Trouilloud et al.

(10) Patent No.: US 7,102,916 B2
(45) Date of Patent: Sep. 5, 2006

(54) METHOD AND STRUCTURE FOR SELECTING ANISOTROPY AXIS ANGLE OF MRAM DEVICE FOR REDUCED POWER CONSUMPTION

(75) Inventors: Philip L. Trouilloud, Norwood, NJ (US); David W. Abraham, Croton, NY (US); John K. DeBrosse, Colchester, VT (US); Daniel Worledge, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 10/710,281

(22) Filed: Jun. 30, 2004

(65) Prior Publication Data

US 2006/0002179 A1    Jan. 5, 2006

(51) Int. Cl.
    *G11C 11/00* (2006.01)
(52) U.S. Cl. ........................... 365/158; 171/173
(58) Field of Classification Search ................. 365/158, 365/171, 173, 130
    See application file for complete search history.

(56) References Cited

U.S. PATENT DOCUMENTS

| | | | |
|---|---|---|---|
| 6,368,878 B1 | 4/2002 | Abraham et al. | |
| 6,430,084 B1 | 8/2002 | Rizzo et al. | |
| 6,430,085 B1 | 8/2002 | Rizzo | |
| 6,545,906 B1 | 4/2003 | Savtchenko et al. | |
| 6,633,498 B1 | 10/2003 | Engel et al. | |
| 6,654,278 B1 * | 11/2003 | Engel et al. | 365/158 |
| 6,711,052 B1 * | 3/2004 | Subramanian et al. | 365/158 |
| 6,818,961 B1 * | 11/2004 | Rizzo et al. | 257/422 |
| 6,937,497 B1 * | 8/2005 | Ju et al. | 365/130 |

* cited by examiner

*Primary Examiner*—Anh Phung
(74) *Attorney, Agent, or Firm*—Margaret A. Pepper; Cantor Colburn LLP (57) ABSTRACT

A method for determining a desired anisotropy axis angle for a magnetic random access memory (MRAM) device includes selecting a plurality of initial values for the anisotropy axis angle and determining, for each selected initial value, a minimum thickness for at least one ferromagnetic layer of the MRAM device. The minimum thickness corresponds to a predefined activation energy of an individual cell within the MRAM device. For each selected value, a minimum applied magnetic field value in a wordline direction and a bitline direction of the MRAM device is also determined so as maintain the predefined activation energy. For each selected value, an applied power per bit value is calculated, wherein the desired anisotropy axis angle is the selected anisotropy axis angle corresponding to a minimum power per bit value.

22 Claims, 8 Drawing Sheets

METHOD AND STRUCTURE FOR SELECTING ANISOTROPY AXIS ANGLE OF MRAM DEVICE FOR REDUCED POWER CONSUMPTION

BACKGROUND OF INVENTION

The present invention relates generally to magnetic random access memory devices, and, more particularly, to a method and structure for selecting the anisotropy axis angle of an MRAM device for reduced power consumption.

Magnetic (or magneto-resistive) random access memory (MRAM) is a non-volatile random access memory technology that could potentially replace the dynamic random access memory (DRAM) as the standard memory for computing devices. The use of MRAM as a non-volatile RAM will eventually allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by a non-magnetic layer (barrier), and arranged into a magnetic tunnel junction (MTJ). Digital information is stored and represented in the memory element as directions of magnetization vectors in the magnetic layers. More specifically, the magnetic moment of one magnetic layer (also referred to as a reference layer) is fixed or pinned, while the magnetic moment of the other magnetic layer (also referred to as a "free" layer) may be switched between the same direction and the opposite direction with respect to the fixed magnetization direction of the reference layer. The orientations of the magnetic moment of the free layer are also known as "parallel" and "antiparallel" states, wherein a parallel state refers to the same magnetic alignment of the free and reference layers, while an antiparallel state refers to opposing magnetic alignments there between.

Depending upon the magnetic state of the free layer (parallel or antiparallel), the magnetic memory element exhibits two different resistance values in response to a voltage applied across the tunnel junction barrier. The particular resistance of the TMR device thus reflects the magnetization state of the free layer, wherein resistance is "low" when the magnetization is parallel, and "high" when the magnetization is antiparallel. Accordingly, a detection of changes in resistance allows a MRAM device to provide information stored in the magnetic memory element (i.e., a read operation). There are different methods for writing a MRAM cell; for example, a Stoner-Wohlfarth astroid MRAM cell is written to through the application of a bidirectional current in a particular direction, in order to magnetically align the free layer in a parallel or antiparallel state. The free layer is fabricated to have a preferred axis for the direction of magnetization called the "easy axis" (EA), and is typically set by a combination of intrinsic anisotropy, strain induced anisotropy and shape anisotropy of the MTJ.

When a sufficiently large current is passed through both a wordline and a bitline of the MRAM, the combined fields of these currents at the intersection of the write and bit lines will rotate the magnetization of the free layer of the particular MTJ located at the intersection of the energized write and bit lines. The current levels are selected such that the combined fields exceed the switching threshold of the free layer. For a Stoner-Wohlfarth astroid MRAM structure, the EA is aligned with the orientation of either the bitline or the wordline.

As the lateral dimension of an MRAM device decreases, several problems can occur. First, the switching field increases for a given shape and film thickness, thus requiring a larger magnetic field for switching. Second, the total switching volume is reduced such that the energy barrier for reversal also decreases, wherein the energy barrier refers to the amount of energy needed to switch the magnetic moment vector from one state to the other. The energy barrier determines the data retention and error rate of the MRAM device, and thus unintended reversals can occur due to thermofluctuations if the barrier is too small. Furthermore, with a small energy barrier it becomes extremely difficult to selectively switch a single MRAM device in an array without inadvertently switching other MRAM devices. Thirdly, because the switching field is produced by shape, the switching field becomes more sensitive to shape variations as the MRAM devices decreases in size.

In this regard, there has been introduced an MRAM device in which the free layer of ferromagnetic material includes multiple (e.g., two) ferromagnetic layers. Due to magnetostatic coupling, the magnetic moments of the two ferromagnetic layers are antiparallel to one another such that there is a net resultant magnetic moment oriented in the anisotropy easy axis. This configuration allows for a different method of writing that has improved selectivity. More specifically, the writing method relies on a "spinflop" phenomenon that lowers the total magnetic energy in an applied field by rotating the magnetic moment vectors of the ferromagnetic layers such that they are nominally orthogonal to the applied field direction but still predominately antiparallel to one another. A rotation, or flop, in combination with a small deflection of each ferromagnetic magnetic moment vector in the direction of the applied field accounts for the decrease in total magnetic energy. Current waveforms applied to the wordline and bitline in a timed sequence cause a magnetic field flux to rotate the effective magnetic moment of the device by approximately 180 degrees.

In the rotational method of MRAM writing, the device is constructed such that the magnetic anisotropy axis is at a 45° angle with respect to the orientation of the word and bitlines. From a power consumption standpoint, a 45° angle orientation of the anisotropy axis is optimal only for architectures in which the field generation capability of the word and bitlines are essentially equivalent to one another. However, in real world MRAM architectures, it is often the case that the field generating efficiency of the word and bitlines are not equivalent. For example, there may be variations in the resistance of the lines and/or variations of the position of the lines relative to the MTJ. In addition, magnetic liners may be used to enhance the writing efficiency of one set of lines as opposed to the other. Moreover, for architectures where an entire line of bits in an array are to be written simultaneously, it may be more advantageous to apply a relatively large current to a wordline and to reduce the amount of current applied to the several bitlines.

Accordingly, it would be desirable to be able to determine a customized anisotropy axis angle for a given MRAM architecture that provides a reduction in power consumption, but that still maintains a threshold activation energy such that the MRAM device maintains selectivity.

SUMMARY OF INVENTION

The foregoing discussed drawbacks and deficiencies of the prior art are overcome or alleviated by a method for determining a desired anisotropy axis angle for a magnetic random access memory (MRAM) device. In an exemplary embodiment, the method includes selecting a plurality of initial values for the anisotropy axis angle and determining, for each selected initial value of the anisotropy axis angle, a minimum thickness for at least one ferromagnetic layer of the MRAM device. The minimum thickness corresponds to a predefined activation energy of an individual cell within the MRAM device. For each selected value of the anisotropy axis angle, a minimum applied magnetic field value in a wordline direction and a bitline direction of the MRAM device is also determined so as to maintain the predefined activation energy. For each selected value of the anisotropy axis angle, an applied power per bit value is calculated, wherein the desired anisotropy axis angle is the selected anisotropy axis angle corresponding to a minimum power per bit value.

In another embodiment, a magnetic random access memory (MRAM) device includes a wordline, a bitline, and a storage element disposed between the wordline and bitline, the storage element further including a reference magnetic layer stack and a free magnetic layer stack. The free magnetic layer stack is formed so have an anisotropy axis angle with respect to axes defined by the wordline and bitline, wherein the anisotropy axis angle is further oriented so as to facilitate a minimum power per bit dissipation for the device.

In still another embodiment, a magnetic random access memory device includes a plurality of wordlines, a plurality of bitlines, and a plurality of storage elements disposed between the wordlines and the bitlines at corresponding intersections thereof. Each of the plurality of storage elements further includes a reference magnetic layer stack and a free magnetic layer stack. The free magnetic layer stack is formed so have an anisotropy axis angle with respect to axes defined by the wordlines and the bitlines, wherein the anisotropy axis angle is further oriented so as to facilitate a minimum power per bit dissipation for the device.

BRIEF DESCRIPTION OF DRAWINGS

Referring to the exemplary drawings wherein like elements are numbered alike in the several Figures.

DETAILED DESCRIPTION

Disclosed herein is a method and structure for selecting the anisotropy axis angle of an MRAM device written by a rotational switching technique, thereby providing reduced power consumption. Briefly stated, the rotational geometry of the anisotropy axis is moved from a conventional 45° angle orientation for certain architectures, such as (for example) where line resistance or field efficiency of the word and bitlines are different, or where multiple bits are to be written simultaneously. A desired adjustment of the anisotropy axis angle is determined for a given efficiency factor by plotting the applied power per bit versus the axis angle adjustment to see what particular angle of rotation yields the lowest value of applied power per bit. The power per bit is a function of the chip design and operating conditions, of the applied magnetic field strength in both the wordline direction, of the bitline direction for a rotational switching cycle, and of the efficiency factor between the wordlines and the bitlines. The rotational switching cycle may be visualized by the path of a two dimensional plot of the applied magnetic field in each direction.

The closed path defined by the applied magnetic field plot, as well as the thickness of the free layer stack needed to maintain a minimum threshold value of activation energy (so as to resist spontaneous flipping of the net magnetic moment and keep the device selective), are a function of the selected anisotropy axis angle. As is discussed hereinafter, the greater the efficiency factor is between the wordlines and the bitlines, the more the optimum anisotropy axis angle deviates from the 45° nominal angle for rotational switching, and, furthermore, the greater the thickness of the free layer stack is increased to maintain a threshold value of activation energy around the entire closed path of the magnetic field plot.

In the examples presented hereinafter, power versus rotational angle curves are plotted for various asymmetric field efficiencies with respect to the wordlines and the bitlines. In this description, the wordline is assumed for efficiency purposes, but in actuality either the bitline or wordline could be the more efficient. These asymmetric field efficiencies may represent an actual discrepancy between the efficiencies of the wordlines and bitlines themselves (e.g., due to different resistances or the use of ferromagnetic liners), or they may represent a situation where several bits along a single wordline are written to simultaneously.

Furthermore, in the following examples described hereinafter, certain initial MRAM device parameters are utilized: namely, an intrinsic anisotropy bias ($H_i$)=10 Oersteds (Oe); a magnetization of material ($M_s$)=1500 emu/cc; and a circular configuration for the free ferromagnetic layers having a diameter of about 300 nm with no exchange coupling therebetween.

Figure 1A:
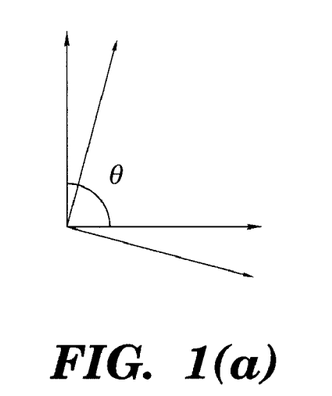
FIG. 1(a) is a legend that illustrates rotation of the word and bit axes from a baseline, symmetric condition.

FIG. 1(a) is a legend that illustrates rotation of the word and bit axes from a baseline, symmetric condition. Although the practical effect of the present power optimization methodology is to rotate the anisotropy axis with respect to the wordlines and bitlines, the "rotated" examples for asymmetric efficiencies will be depicted in terms of the angle, θ, between a "rotated" word axis and a "non-rotated" bit axis for ease of illustration. Thus, where the word axis is not rotated, θ is equal to 90° degrees.

Figure 1B:
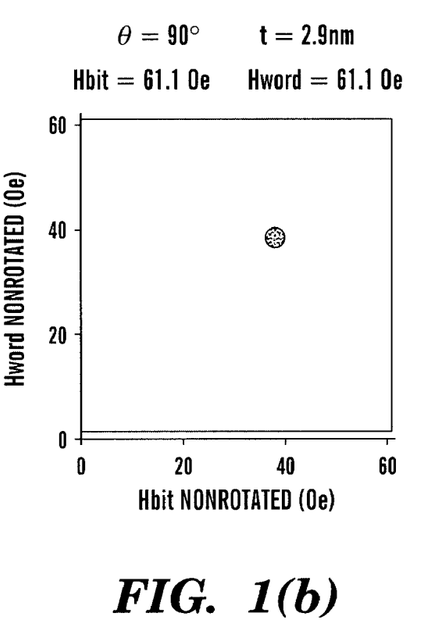
FIG. 1(b) is a two-dimensional field plot for a rotational switching cycle for an MRAM device in which a conventional 45° angle orientation of the anisotropy axis is utilized.
Figure 1C:
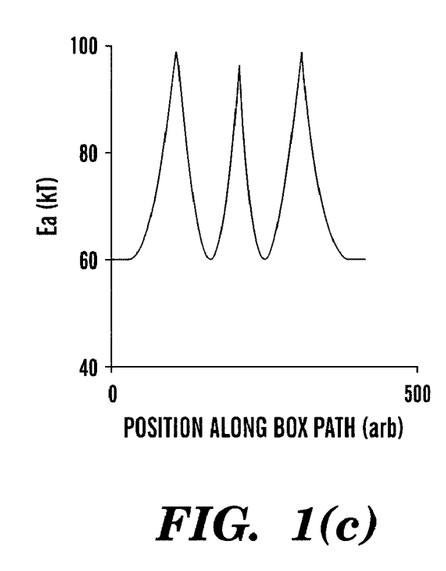
FIG. 1(c) is an activation energy plot corresponding to the closed loop switching path of FIG. 1(b)

Referring now to FIGS. 1(b) and 1(c), there is shown a baseline example in which a conventional 45° angle orientation of the anisotropy axis is utilized, such as would be the case where there the wordlines and bitlines have essentially the same efficiency with respect to one another. In this case, the magnitude of the pulsed magnetic field in the word direction (y-axis), $H_{word}$, is the same as the magnitude of the pulsed magnetic field in the bit direction (x-axis), $H_{bit}$. The two-dimensional field plot for this rotational switching cycle is shown in FIG. 1(b), represented by a square shaped, closed path surrounding the spin-flip point. Correspondingly, the activation energy plot in FIG. 1(c) demonstrates that a minimum activation energy (e.g., 60 kT) is maintained throughout the entire switching cycle (i.e., along the position of the square path of FIG. 1(b)).

Figure 2:
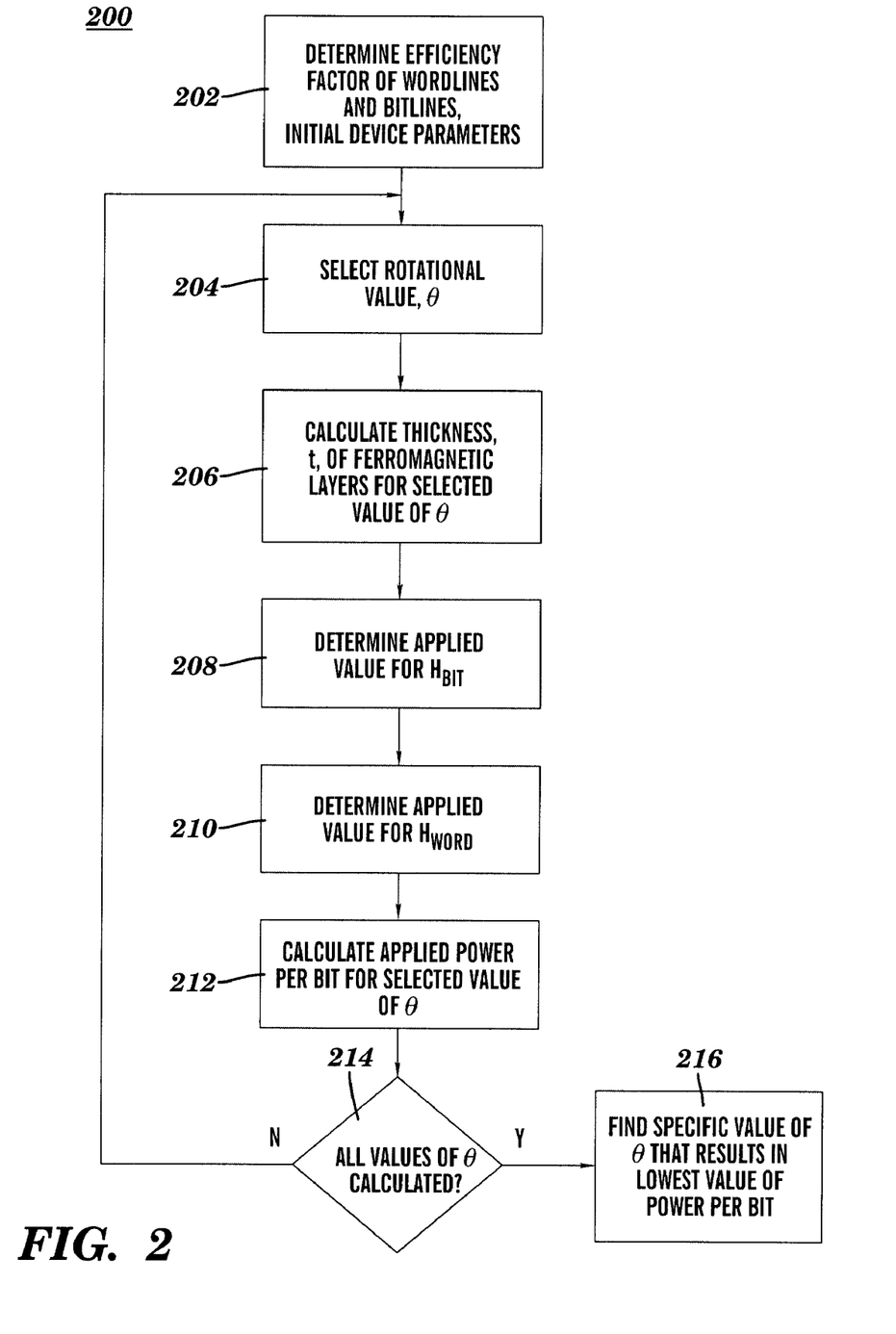
FIG. 2 is a flow diagram illustrating a method for selecting the anisotropy axis angle of an MRAM device for reduced power consumption, in accordance with an embodiment of the invention.

As stated previously, however, there may be architectures where the efficiency of the wordlines differs from the efficiency of the bitlines. Therefore, in accordance with an embodiment of the invention, FIG. 2 is a flow diagram illustrating a method 200 for selecting the anisotropy axis angle of an MRAM device for reduced power consumption, in accordance with an embodiment of the invention. Beginning at block 202, the efficiency factor with respect to the wordlines and bitlines is determined, as well as initial device parameters for the MRAM device as described above. For example, in one representative layout, the power per bit ($P_b$) is proportional to the chip voltage ($V_{DD}$) and to the sum of the bit and word fields ($H_{bit}$ and $H_{word}$) scaled by their respective efficiencies ($N_b$ and $N_w$), and may be expressed as follows: $P_b = V_{DD} \cdot (N_b \cdot H_{bit} + N_w \cdot H_{word})$ (Eq. 1). In block 204, a first rotational value for θ is selected. The value of θ defines the angle of the field applied in the word direction with respect to the toggle point (lying on the baseline 45° axis of the two-dimensional field plot), which in turn determines the thickness of the ferromagnetic layers of the free stack. Thus, as shown in block 206, the thickness, t, is calculated to maintain the minimum desired (predefined) activation energy. This determines the location of the toggle point on the baseline 45° axis.

In block 208, an applied $H_{bit}$ is also determined to be twice the distance from the word field axis to the toggle. Next, as shown in block 210, an applied value for $H_{word}$ is determined (half-select value) such that the minimum predefined activation energy is maintained. Again, both $H_{word}$ and $H_{bit}$ will be a function of θ. Then, in block 212, the applied power per bit is calculated and plotted for the selected value of θ, the applied power being a function of $H_{word}$ and $H_{bit}$. The process is repeated until a power per bit is calculated for each selected value of θ, as reflected by decision block 214. Once the power plot is completed, it is analyzed to find the specific value of θ that results in the lowest value of power per bit, as shown in block 216.

Figure 3A:
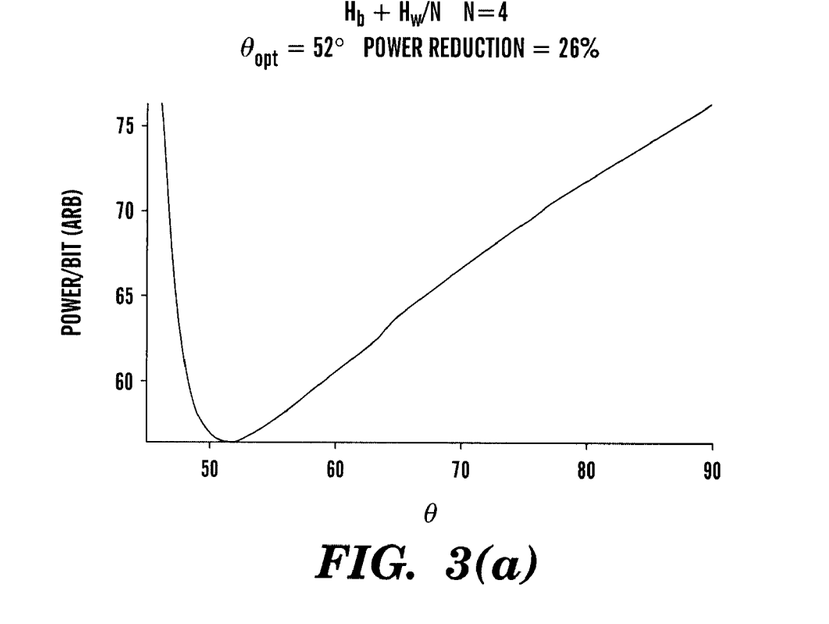
FIG. 3(a) is an exemplary plot of power per bit versus θ for an MRAM device having an efficiency factor of 4, using the method of FIG. 2.
Figure 3B:
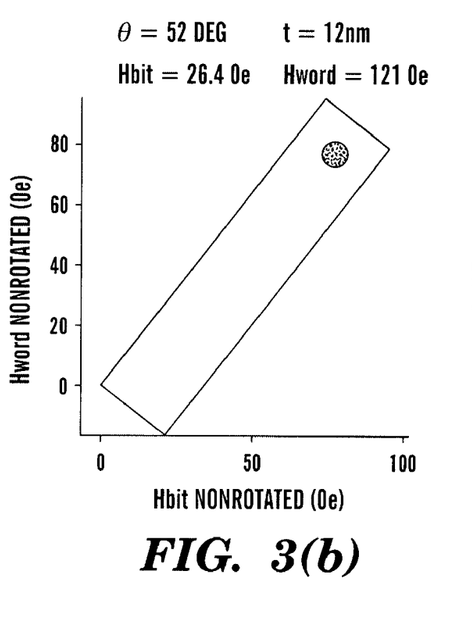
FIG. 3(b) is a two-dimensional field plot for a rotational switching cycle at the determined optimal value of θ from FIG. 3(a)
Figure 3C:
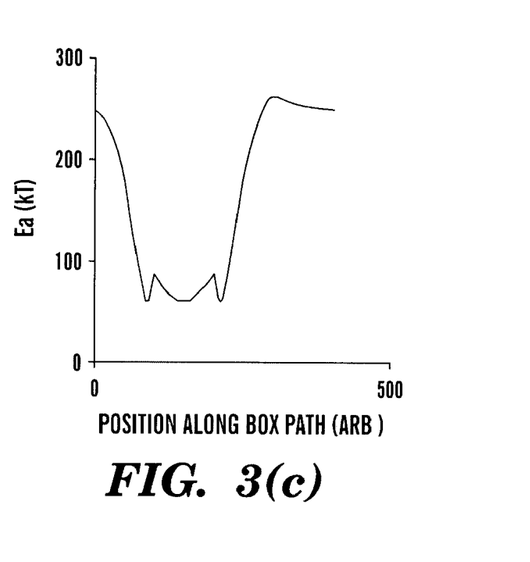
FIG. 3(c) is an activation energy plot corresponding to the rotated, closed loop switching path of FIG. 3(b)

FIGS. 3(a) through 3(c) illustrate one implementation of the method of FIG. 2, wherein the wordlines of the MRAM device are four times as efficient as the bitlines. This could be the result, for example, from the use ferromagnetic liners in conjunction with the wordlines and not the bitlines or, alternatively, from an architecture having four bits per word. In either case, the use of equal fields in the word and bit directions would result in the expenditure of more total write power than actually needed. Accordingly, the magnitude of the applied magnetic field in the bit direction ($H_{bit}$) can be decreased while the magnitude of the applied magnetic field in the word direction ($H_{word}$) can be increased. In other words, the closed path defined by the magnetic field plot will change from a square shape to a more rectangular shape (i.e., longer and thinner).

In particular, FIG. 3(a) illustrates the resulting plot of power per bit versus θ for an efficiency factor of 4 for the entire range of rotation (i.e., maximum rotation at θ=45° through no rotation at θ=90°), in accordance with the methodology described in FIG. 2. As can be seen, the minimum power for this efficiency factor occurs at an angle of about θ=52°, which represents about a 26% reduction in power than for a non-rotated device. FIG. 3(b) illustrates the closed path of the applied field in the wordline and bitline field around the toggle point for the minimum power angle of θ=52°. As is shown in FIG. 3(c), the magnitude of the applied fields in both directions are sufficient to maintain a minimum activation energy of 60 kT is along the entire closed loop path. It will be noted that the tradeoff in maintaining the minimum activation energy is an increased thickness in each of the ferromagnetic portions of free layer from about 2.9 nm (non-rotated) to about 12 nm at θ=52°.

Figure 4A:
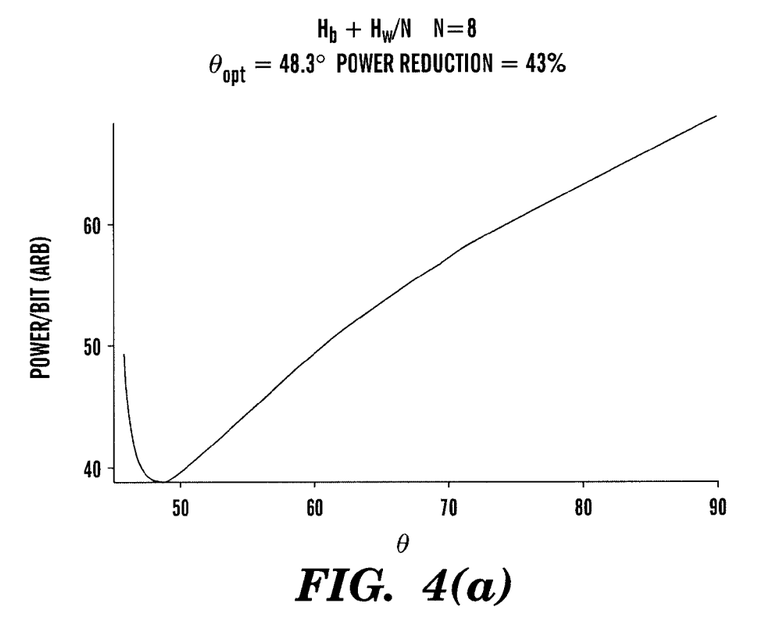
FIG. 4(a) is an exemplary plot of power per bit versus θ for an MRAM device having an efficiency factor of 8, using the method of FIG. 2.
Figure 4B:
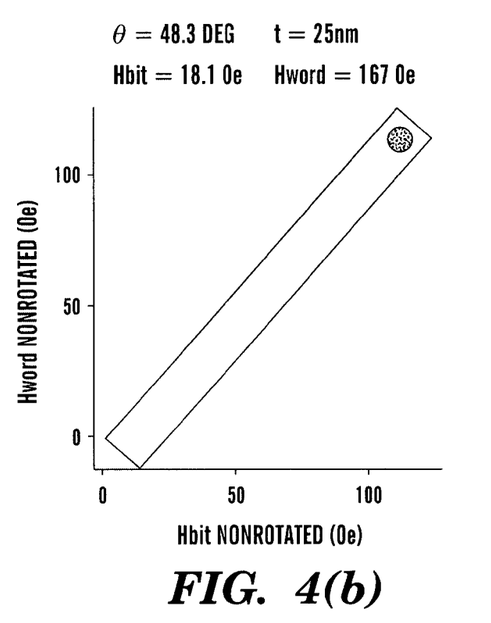
FIG. 4(b) is a two-dimensional field plot for a rotational switching cycle at the determined optimal value of θ from FIG. 3(b)
Figure 4C:
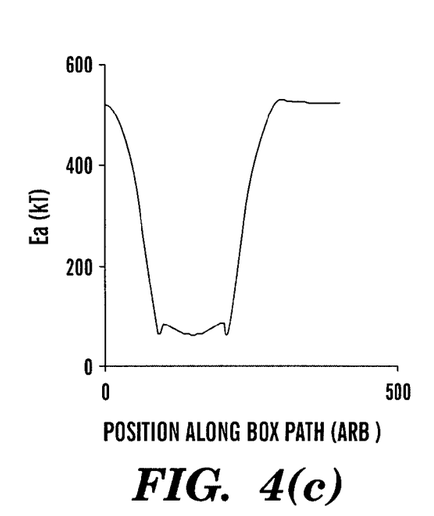
FIG. 4(c) is an activation energy plot corresponding to the rotated, closed loop switching path of FIG. 4(b)

Referring now to FIGS. 4(a) through 4(c), there is illustrated another example of the available power reduction using anisotropic axis rotation. In this example, it is assumed there is an efficiency factor of 8 (again, such as from an architecture of 8 bits per word, or the wordlines being 8 times as efficient as the bitlines). FIG. 4(a) again plots the rotation angle versus power per bit in accordance with the method outlined in FIG. 2, only this time illustrating a minimum power per bit at an angle of θ=48.3°. It will particularly be noted that the decrease in total power at θ=48.3° versus θ=90° is a 43% reduction in power. As will be noted from FIG. 4(b), the rectangular closed path is now even more elongated in the word direction and more constricted in the bit direction as the thickness of the free layer is further increased to about 25 nm. FIG. 4(c) establishes the activation energy versus position along the closed path of FIG. 4(b), again establishing that the three minima shown therein satisfy a minimum activation energy for the calculated thickness, $H_{word}$ and $H_{bit}$.

Figure 5A:
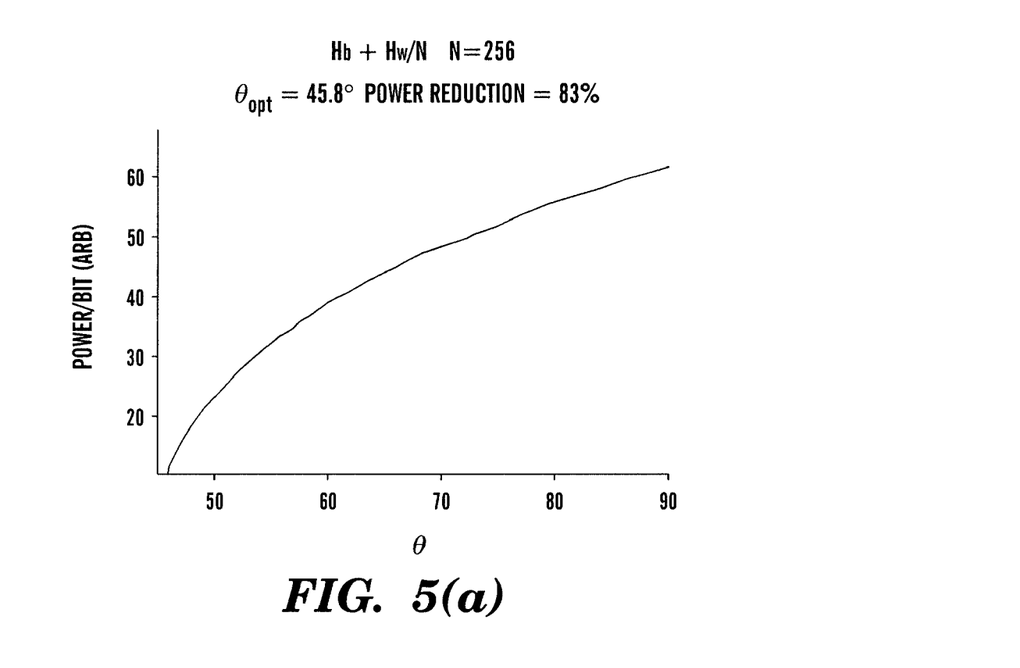
FIG. 5(a) is an exemplary plot of power per bit versus θ for an MRAM device having an efficiency factor of 256, using the method of FIG. 2.
Figure 5B:
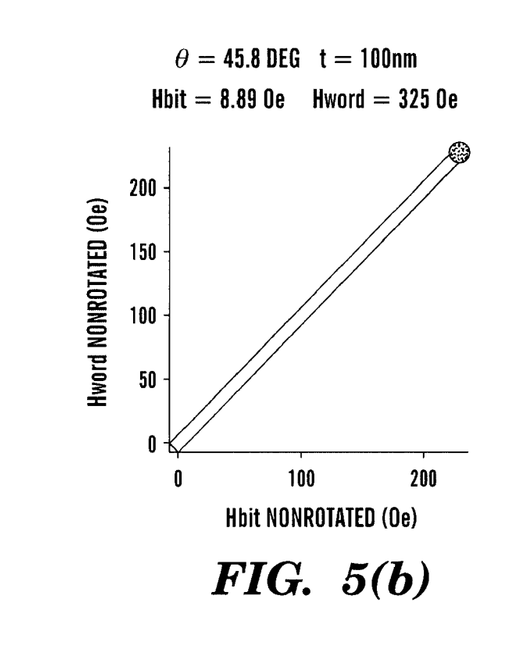
FIG. 5(b) is a two-dimensional field plot for a rotational switching cycle at the determined optimal value of θ from FIG. 5(b)
Figure 5C:
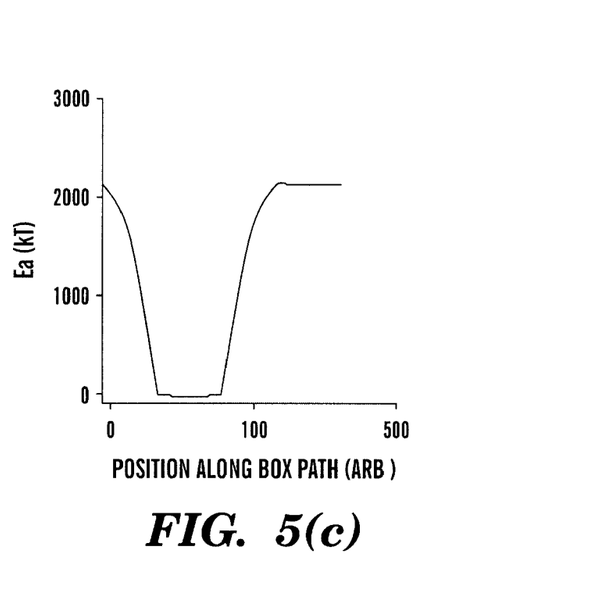
FIG. 5(c) is an activation energy plot corresponding to the rotated, closed loop switching path of FIG. 5(b)

Although the available power savings increases the greater the asymmetry is between the wordlines and bitlines, there may be a practical limit to this benefit once the increase in layer thickness reaches a certain level. FIGS. 5(a) through 5(c) illustrate this point, wherein the asymmetry between the wordlines and bitlines is now a factor of 256 (the more likely cause in this instance due to an architecture of 256 bits per word). As illustrated in the power per bit plot of FIG. 5(a), the optimum angle for minimum power dissipation is at about θ=45.8°, which in this case represents an 83% reduction in power with respect to θ=90°. As will be observed from the plot of FIG. 5(b), the closed path is very elongated in the word direction and very narrow in the bit direction. In other words, the value of $H_{word}$(325 Oe) is much larger that the value of $H_{bit}$(8.89 Oe).

Moreover, in order to maintain a minimum activation energy at θ=47°, the free layer thickness is now increased to 100 nm. Thus, although the power savings can be significant for high efficiency disparities and large rotational values of the word axis, the substantial tradeoff in the form of increased thickness could make such a rotation undesirable for certain applications. However, for a maximum acceptable thickness, power reduction can be achieved by a smaller rotation.

Figure 6A:
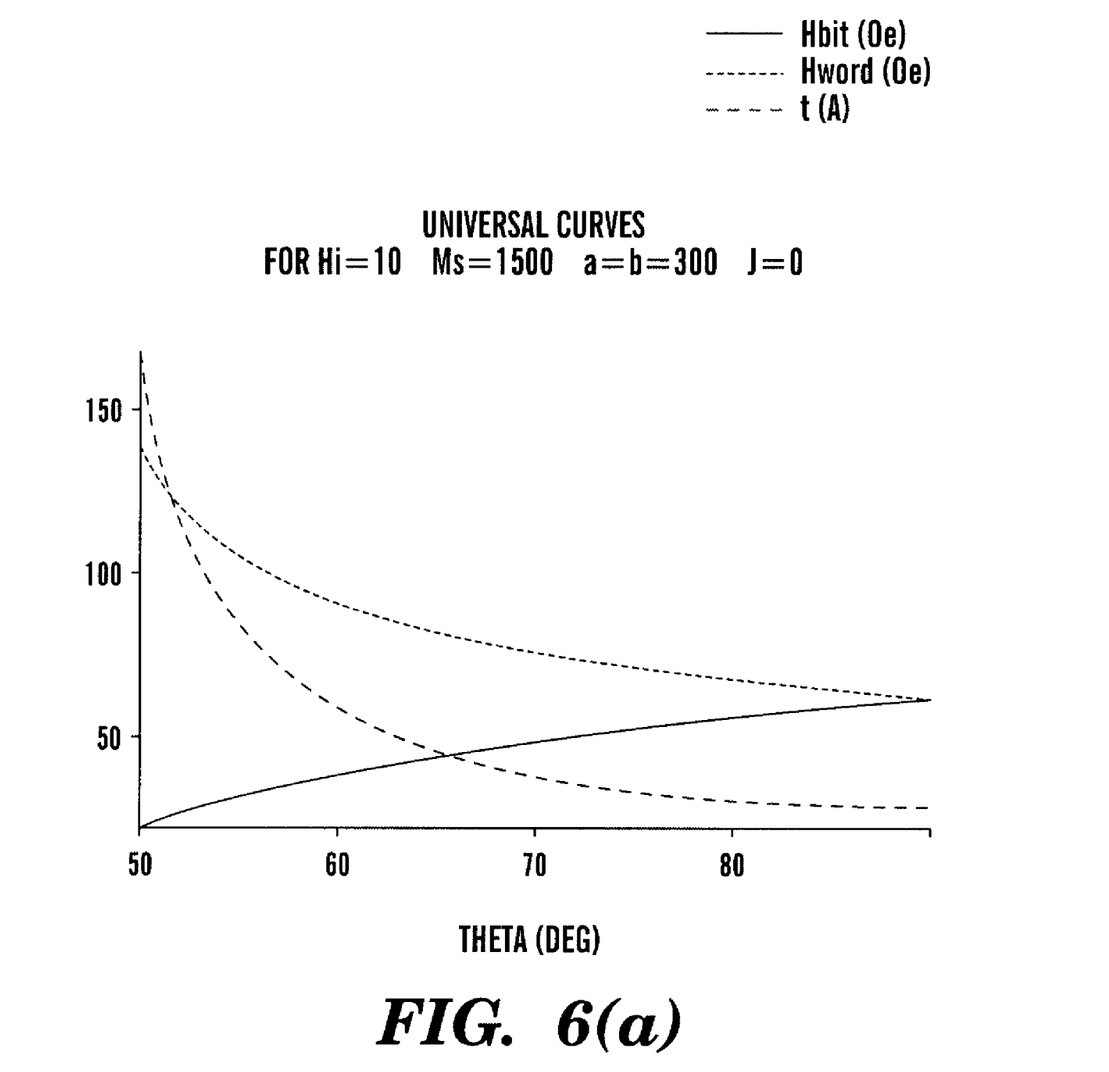
FIG. 6(a) is an exemplary set of universal curves plotting the applied magnetic field in the word and bit directions, and the thickness of the free layer as a function of rotational angle, θ.

The determination of thickness, $H_{word}$ and $H_{bit}$ in the optimization methodology described herein may be achieved through a set of universal curves, such as shown in FIG. 6(a). The universal curves include the applied magnetic field in the word and bit directions, and the thickness of the free layer as a function of rotational angle, θ. Again, the curves particularly correspond to the MRAM device parameters described above. When viewed from right to left, it will be noted that $H_{word}$ increases as rotation in-word creases, $H_{bit}$ decreases as rotation increases, and thickness increases as rotation increases. From the values of $H_{word}$, $H_{bit}$, and the efficiency factor, the power per bit can be calculated for a given angle.

It should be noted that, if the optimum thickness is more than could be supported or desired because of fabrication limitations, power reduction can still be achieved by using the angle of FIG. 6(a) corresponding to both the maximum acceptable thickness and the bit and word fields corresponding to that angle.

Figure 6B:
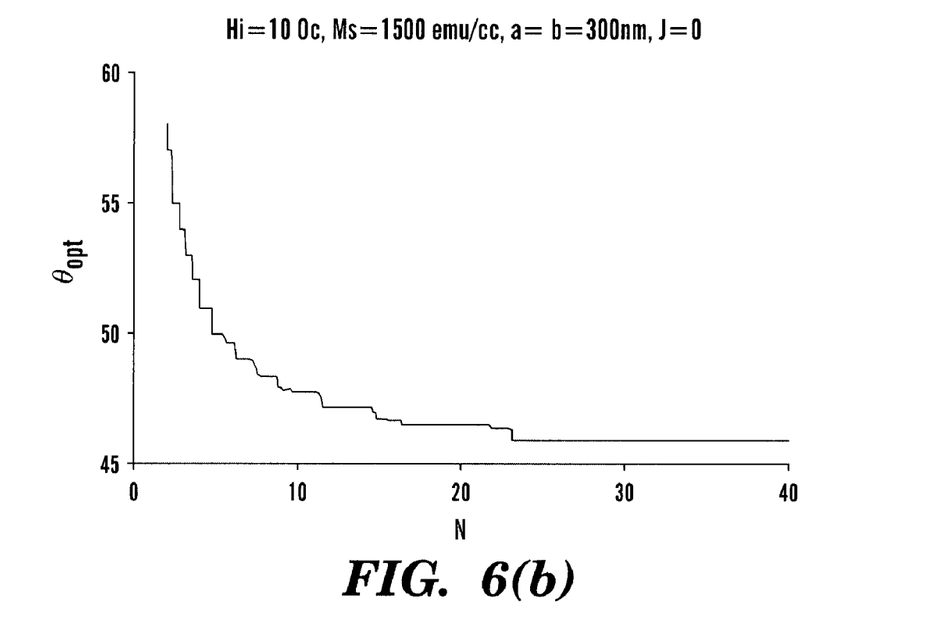
FIG. 6(b) is a plot illustrating the optimum angle as a function of the efficiency factor, N.
Figure 6C:
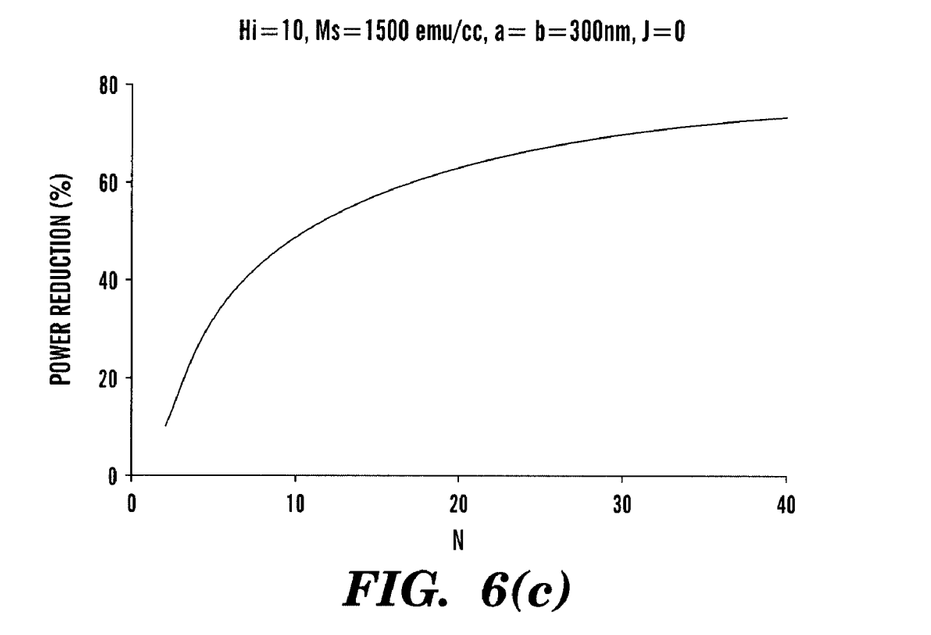
FIG. 6(c) is a plot illustrating power savings as compared to using a value of θ=90°.

FIG. 6(b) illustrates an example of the optimum angle as a function of efficiency for a power per bit that is proportional to the chip voltage times the wire currents. The visible discretization of the curve is an artifact of the calculation. FIG. 6(c) illustrates an example of the percentage power reduction versus efficiency factor by using the optimized angle.

Figure 7:
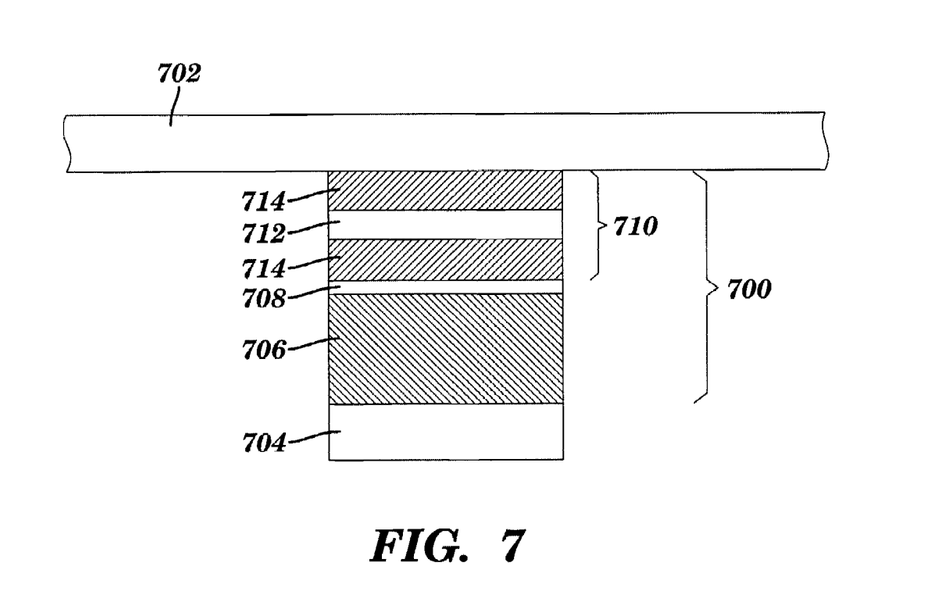
FIG. 7 is a simplified sectional view of a single storage element of an MRAM array structure configured for rotational switching and having an anisotropy axis thereof optimized for low power dissipation, in accordance with a further embodiment of the invention.
Figure 8:
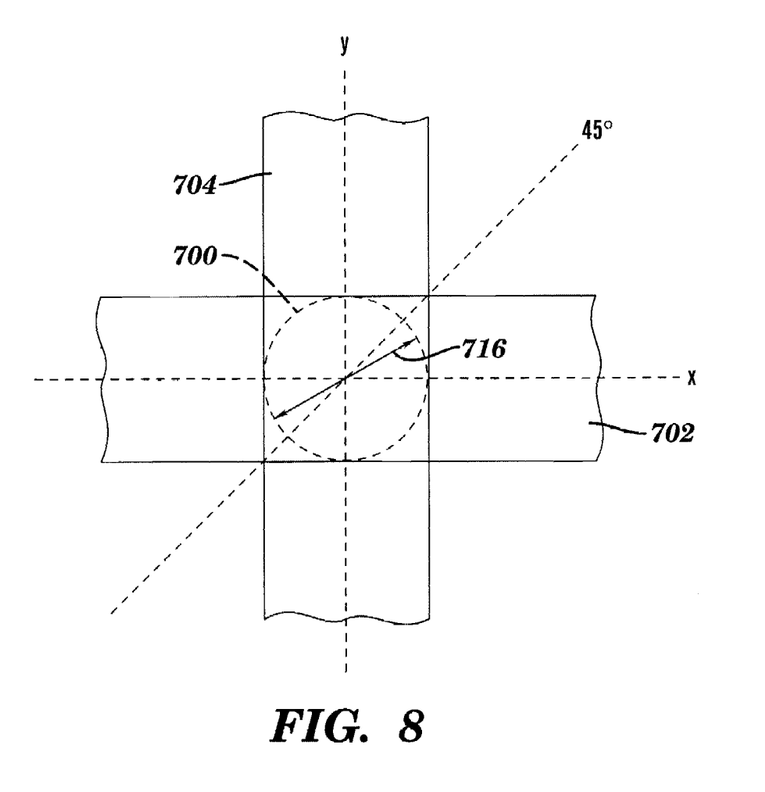
FIG. 8 is a top view of the MRAM structure depicted in FIG. 7.

Through the use of the above described optimization methodology, MRAM devices utilizing rotation switching may be constructed with the anisotropic axis thereof corresponding to a minimum power per bit dissipation. Referring now to FIGS. 7 and 8, there is shown an exemplary MRAM structure configured for rotational switching and having an anisotropy axis thereof optimized for low power dissipation, in accordance with a further embodiment of the invention.

More specifically, FIG. 7 illustrates a simplified sectional view of a single storage element 700 of an MRAM array structure, in which the storage element 700 is disposed between a wordline 702 and a bitline 704. In the example illustrated, the wordline 702 is shown positioned on top of storage element while the bitline 704 is positioned on the bottom of the storage element 700 and is oriented at a 90° angle with respect to the wordline 702. It will be appreciated, however, that the relative positions of the wordline 702 and bitline 704 may be reversed (i.e., the wordline 702 on the bottom of the storage element 700 and the bitline 704 on the top of the storage element 700). It will also be appreciated that an actual MRAM array structure will include several storage elements, each located at corresponding intersections of an array or wordlines and bitlines.

In any case, the storage element 700 includes a pinned (reference) layer 706, a tunneling barrier 708, and a free layer 710, wherein the tunneling barrier 708 is sandwiched between the pinned layer 706 and the free layer. In addition, the free layer 710 is characterized by (at least) a tri-layer structure having a non-magnetic spacer layer 712 sandwiched between a pair of ferromagnetic layers 714. Generally, the ferromagnetic layers 714 may include elements such as Ni, Fe, Co, or combinations thereof.

FIG. 8 is a top view of the MRAM structure depicted in FIG. 7. Although the illustrated embodiment features a circular shaped storage element 700 (as in the examples described above), it should be understood that the storage element 700 may take the form of other shapes, such as square, elliptical, rectangular, or diamond, for example.

Depending on the established efficiency factor between the wordline 702 and bitline 704, an optimized anisotropy axis 716 is determined for the storage element. Assuming that the wordline 702 and bitline 704 are not equally efficient (for whatever reason), then the anisotropy axis 716 of the of the storage element 700 will not lie in the 45° axis with respect to the orthogonal x and y-axes defined by the wordline 702 and 704, as in a conventional rotationally switched MRAM device. Again, the particular angle of anisotropy axis 716 is determined based on the rotational angle yielding the lowest power per bit for the particular efficiency factor. Once determined, the desired anisotropy axis is defined in accordance with selective deposition, photolithography processing, etching, and magnetic field application techniques known to one skilled in the art.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for determining a desired anisotropy axis angle for a magnetic random access memory (MRAM) device, the method comprising:

selecting a plurality of initial values for the anisotropy axis angle;

determining, for each selected initial value of the anisotropy axis angle, a minimum thickness for at least one ferromagnetic layer of the MRAM device, wherein said minimum thickness corresponds to a predefined activation energy of an individual cell within the MRAM device;

determining, for each selected value of the anisotropy axis angle, a minimum applied magnetic field value in a wordline direction and a bitline direction of the MRAM device so as maintain said predefined activation energy; and calculating, for each selected value of the anisotropy axis angle, an applied power per bit value;

wherein the desired anisotropy axis angle is the selected anisotropy axis angle corresponding to a minimum power per bit value.

2. The method of claim 1, wherein said power per bit value for a given selected anisotropy axis angle is calculated from said minimum applied magnetic field value in said wordline and bitline directions associated therewith.

3. The method of claim 2, wherein said power per bit value is further calculated from an efficiency factor between wordlines and bitlines of the MRAM device.

4. The method of claim 3, wherein said minimum thickness and said minimum applied magnetic field value in said wordline and bitline directions are determined as a function of said selected value of the anisotropy axis angle through a set of universal curves.

5. The method of claim 3, wherein the desired anisotropy axis is configured for rotational switching of the MRAM device.

6. The method of claim 1, further comprising:
establishing a maximum desired thickness for said at least one ferromagnetic layer of the MRAM device; and
wherein the desired anisotropy axis angle is the selected anisotropy axis angle corresponding to a minimum power per bit value for a thickness less than or equal to said maximum desired thickness for said at least one ferromagnetic layer of the MRAM device.

7. A magnetic random access memory (MRAM) device configured for rotational switching of an anisotropy axis associated therewith, comprising:
a wordline;
a bitline;
a storage element disposed between said wordline and said bitline, said storage element further comprising a reference magnetic layer stack and a free magnetic layer stack; and
said free magnetic layer stack is formed so have an anisotropy axis angle with respect to axes defined by said wordline and said bitline, wherein said anisotropy axis angle is further oriented so as to facilitate a minimum power per bit dissipation for the device.

8. The MRAM device of claim 7, wherein said anisotropy axis angle is based on an efficiency factor between said wordline and said bitline.

9. The MRAM device of claim 8, wherein:
said wordline is disposed in a direction orthogonal to said bitline; and
said anisotropy axis angle is a non-45° angle with respect to said axes defined by said wordline and said bitline.

10. The MRAM device of claim 8, wherein said free magnetic layer stack further comprises a pair of ferromagnetic layers separated by a non-ferromagnetic spacer.

11. The MRAM device of claim 8, wherein said efficiency factor is greater than 1.

12. The MRAM device of claim 11, wherein said efficiency factor is determined by a difference in field generating efficiency between said wordline and said bitline.

13. The MRAM device of claim 11, wherein said efficiency factor is determined by a number of bits, N that are written by said wordline, wherein N is greater than 1.

14. The MRAM device of claim 7, wherein said anisotropy axis angle is further oriented so as to facilitate a minimum power per bit dissipation corresponding to a thickness of at least one ferromagnetic layer of said free magnetic layer stack that is less than or equal to a maximum desired thickness thereof.

15. A magnetic random access memory (MRAM) device, comprising:
a plurality of wordlines;
a plurality of bitlines;
a plurality of storage elements disposed between said wordlines and said bitlines at corresponding intersections thereof, each of said plurality of storage elements further comprising a reference magnetic layer stack and a free magnetic layer stack; and
said free magnetic layer stack is formed so have an anisotropy axis angle with respect to axes defined by said wordlines and said bitlines, wherein said anisotropy axis angle is further oriented so as to facilitate a minimum power per bit dissipation for the device.

16. The MRAM device of claim 15, wherein said anisotropy axis angle is based on an efficiency factor between said wordlines and said bitlines.

17. The MRAM device of claim 16, wherein:
said wordlines are disposed in a direction orthogonal to said bitlines; and
said anisotropy axis angle is a non-45° angle with respect to said axes defined by said wordlines and said bitlines.

18. The MRAM device of claim 16, wherein said free magnetic layer stack further comprises a pair of ferromagnetic layers separated by a non-ferromagnetic spacer.

19. The MRAM device of claim 16, wherein said efficiency factor is greater than 1.

20. The MRAM device of claim 19, wherein said efficiency factor is determined by a difference in field generating efficiency between said wordlines and said bitlines.

21. The MRAM device of claim 18, wherein said efficiency factor is determined by a number of bits, N that are written by said wordline, wherein N is greater than 1.

22. The MRAM device of claim 15, wherein said anisotropy axis angle is further oriented so as to facilitate a minimum power per bit dissipation corresponding to a thickness of at least one ferromagnetic layer of said free magnetic layer stack that is less than or equal to a maximum desired thickness thereof.

* * * * *